United States Patent
Naum et al.

(10) Patent No.: US 8,343,379 B2
(45) Date of Patent: Jan. 1, 2013

(54) WARM WHITE LIGHT-EMITTING DIODE AND THIN FILM AND ITS RED PHOSPHOR POWDER

(75) Inventors: Soshchin Naum, Changhua (TW); Wei-Hung Lo, Taipei (TW); Chi-Ruei Tsai, Taipei (TW)

(73) Assignees: Wei-Hung Lo, Taipei (TW); Chien-Yi Chen, Niaosong Township (TW)

( * ) Notice: Subject to any disclaimer, the term of this patent is extended or adjusted under 35 U.S.C. 154(b) by 594 days.

(21) Appl. No.: 12/477,195

(22) Filed: Jun. 3, 2009

(65) Prior Publication Data
US 2009/0315047 A1 Dec. 24, 2009

(30) Foreign Application Priority Data
Jun. 20, 2008 (TW) ................. 97123218 A

(51) Int. Cl.
*C09K 11/64* (2006.01)
*C09K 11/02* (2006.01)
*H01L 33/00* (2010.01)

(52) U.S. Cl. ............ 252/301.4 R; 252/301.36; 428/690; 313/503; 257/98

(58) Field of Classification Search ........... 252/301.4 R, 252/301.36; 313/503; 428/690; 257/98
See application file for complete search history.

(56) References Cited

OTHER PUBLICATIONS

Jiang et al, "Synthesis and optical properties of ultra-fine Sr5Al2O8:Eu 3+ nanorod phoshor from a low-heating-temperature solid-state precursor method", Materials Science and Engineering B, 145, 2007, 23-27.*

* cited by examiner

*Primary Examiner* — Carol M Koslow
(74) *Attorney, Agent, or Firm* — The Weintraub Group, P.L.C.

(57) ABSTRACT

The invention discloses a red phosphor powder which is based on strontium (Sr) aluminate and using europium (Eu) as exciting agent, and is characterized by that its chemical equivalence formula is $(SrO)_4(\Sigma Me^{+2}O)_1Al_2O_3$: Eu, wherein $Me^{+2}$=Mg and/or Ca and/or Ba. The present invention also discloses a manufacturing process for the red phosphor powder and a warm white light-emitting diode employing the phosphor powder. Moreover, the present invention also discloses a multi-layer polyethylene thin film using the red phosphor powder.

10 Claims, No Drawings

WARM WHITE LIGHT-EMITTING DIODE AND THIN FILM AND ITS RED PHOSPHOR POWDER

FIELD OF THE INVENTION

The present invention relates to the field of microelectronics, and in particular to a red phosphor powder related to the modern technology field broadly called solid state lighting and a warm white light-emitting diode employing the phosphor powder.

BACKGROUND OF THE INVENTION

With the technology foundation of the solid state lighting, some lighting facilities have been produced for daily and landscape uses as well as high power lighting facilities for industrial uses. These lighting facilities have a somewhat lower color temperature, $T \leq 3500K$, falling into the category of warm white lighting. If the color temperature is higher, $T>4600K$, the semiconductor facilities will be categorized as cold white light.

The first red phosphor powder is a Lepard phosphor powder with a formula of $Me^{II}S:Eu^{+2}$, wherein $Me^{II}$ is equal to $Ca^{+2}$, $Sr^{+2}$, or $Ba^{+2}$. The second type of phosphor powder is the compound of $A^{II}B^{IV}$ wherein $A^{II}=Zn$, Cd and $B^{IV}=S$, Se, Te or their inter-soluble compounds, for example, $(ZnS)_{0.4}(CdS)_{0.6}$. Ag. The application of these phosphor powders are now very limited because (1) $Me^{II}S$ sulphide is low in chemical stability and readily decomposed in air, and (2) $A^{II}B^{IV}$ compound contains cadmium, which is a strong toxin.

In 1965, the first rare earth phosphor powder was developed with a vanadic acid, $(Y,Eu)_1VO_4$, as its substrate (please refer to Handbook of Phosphors Press NY, 1999). The red phosphor powder has been produced in batches. The excited wavelength of the near ultraviolet of the phosphor powder is $\lambda=365$ nm. Since the phosphor powder has a good quality and high performance, it has been widely applied.

It was followed by the development of oxide phosphor powder: $Y_2O_3$:Eu or $Gd_2O_3$:Eu, with an excited ultraviolet wavelength of $\lambda=254$ nm. Since the stability and performance of the phosphor powder are very high, it is still now used in the light sources with $\eta=50$ lumen/watt. Later, the invention of sulphur oxide phosphor powder with a formula of $(\Sigma Ln)_2O_2S$, wherein $\Sigma Ln=Y$, La, Gd, Eu, Tb, Sm. Based on the sulfur oxide phosphor powder, new cathode phosphor powder, X-ray phosphor powder, and laser phosphor powder were invented (please refer to the Russian Patent No. 1603763 by N. P. Soschin et al., Dec. 1, 1988). Although widely used, the red phosphor powder based on Yttrium (Y)-Lanthanum (La)-Gadolinium (Gd)-Europium (Eu) sulfide has a substantive drawback: the red light with wavelength $\lambda=616$, 626, and 708 nm can only be excited to luminesce at the near-ultra violet subband of wavelength $\lambda=365\sim405$ nm. Therefore, the phosphor powder can only be applied in the semiconductor light source of $\lambda=395$ nm, and not suitable to be excited by the blue-light semiconductor heterojunction. The drawbacks of this phosphor powder based on $(Y,Eu)_2O_2S$ has been described in the Russian Patent No. 2064482 please refer to the Russian Patent No. 2064482 by N. P. Soschin et al., Apr. 18, 1991).

People later tried to develop phosphor powder which can be excited by blue light heterojunction to emit red light. A series of articles concerning the new oxide phosphor powder, $CaSiAlN_3$:Ce (please refer to Hanz Luo Jiang et al and Materials Science and Engineering MSB 115118) details these experiments taken. However, the production of material $CaSiAlN_3$:Ce is very complicated because of its low light output and high cost.

The present inventors of the present invention have recently attempted to make the phosphor powder $Sr_5Al_2O_8$:$Eu^{+3}$ disclosed in a newly published patent as sample (please refer to N. P. Soschin, high-powder white light semiconductor). Nevertheless, the inventors of the patent did not clarify the exact composition of the phosphor powder when detailing the synthetic process, nor specify the realizable oxidation state of the main exciting agent $Eu^{+3}$. Also, the inventors did not specify the crystal structure of the compound and the concentration ratio of SrO and $Al_2O_3$, which are drawbacks demanding improvement.

SUMMARY OF THE INVENTION

To overcome the prior drawbacks described above, the main objective of the present invention is to provide a red phosphor powder and warm white Light-emitting diode employing the phosphor powder capable of overcoming the aforementioned drawbacks.

To overcome the prior drawbacks described above, another objective of the present invention is to provide a red phosphor powder and method of manufacturing it. A synthetic process is employed to produce the phosphor powder, which is excited by short-wavelength light; ultraviolet, violet, blue, pale blue, and blue-green; and emits broadband red light in the wavelength $\lambda=600\sim650$ nm.

To overcome the prior drawbacks described above, another objective of the present invention is to provide a phosphor powder of high quantum yield and high performance.

To overcome the prior drawbacks described above, another objective of the present invention is to provide a super-fine phosphor powder with a particle size reaching $1\sim1.5$ μm, which has two potential applications: warm white light-emitting diode and greenhouse light conversion agricultural film.

To achieve the aforementioned objectives of the present invention, a red phosphor powder according to the present invention is based on strontium (Sr) aluminate and uses europium (Eu) as exciting agent, and is characterized by that its chemical equivalence formula: $(SrO)_4(\Sigma Me^{+2}O)_1Al_2O_3$:Eu, wherein $Me^{+2}=Mg$ and/or Ca and/or Ba.

The present invention also discloses a manufacturing process for the red phosphor powder and a warm white light-emitting diode employing the phosphor powder. Moreover, the present invention also discloses a multi-layer polyethylene using the red phosphor powder.

To achieve the aforementioned objectives of the present invention, a warm white phosphor powder according to the present invention has an In—Ga—N heterojunction as its substrate and the surface of the In—Ga—N heterojunction is covered with phosphor powder based on yttrium aluminum garnet, which is characterized by that the yttrium aluminum garnet is added with the aforementioned red phosphor powder.

To achieve the aforementioned objectives of the present invention, a thin, multi-layer polyethylene film is used in a greenhouse or warm house. The thin, multi-layer polyethylene film is based on high density polyethylene and its derivative contains inorganic phosphor powder and is characterized by the film using the aforementioned red phosphor powder as its constituent.

DETAILED DESCRIPTION OF THE INVENTION

First of all, the objective of the present invention is to overcome the drawbacks of the aforementioned phosphor powder and the warm white light-emitting diode employing the phosphor powder. To achieve the objective, the red phosphor powder according to the present invention is based on strontium (Sr) aluminate and uses europium (Eu) as an exciting agent, and is characterized by that its chemical equivalence formula is $(SrO)_4(\Sigma Me^{+2}O)_1Al_2O_3$: Eu, wherein $Me^{+2}$=Mg and/or Ca and/or Ba; wherein the exciting agent europium has two different oxidation states $Eu^{+2}$ and $Eu^{+3}$; the ionic ratio of the different states of the exciting agent europium is $[Eu^{+2}]/[Eu^{+3}]$=1:10~1:1; the concentrations of the main anions of group II A are as follows: $Mg^{+2}$ from about 0.025 to about 0.90, $Ca^{+2}$ from about 0.001 to about 0.50, and $Ba^{+2}$ from about 0.001 to about 0.50, and wherein the sum of the concentrations or atomic fractions is equal to 1 (Mg+Ca+Ba=1; the maximum of the excitation spectrum of the phosphor powder is in the range of $390 \leq \lambda \leq 550$ nm, and the maximum of the excitation spectrum is related to the charge transfer in the band: charge transfer occurring between $Eu^{+3}$ and $O^{-2}$ and thus forming a charge coalescence $Eu^{+2}+O^{-1}$; and the phosphor powder excited by short wavelength radiation, shorter than 460 nm, emits in the orange-red zone, $\lambda > 585$ nm.

The physical chemistry principle of the phosphor powder according to the present invention is outlined hereinafter. First, a new composition framework of the phosphor powder according to the present invention is developed to replace $(SrO)_5Al_2O_3$, which cannot be manufactured easily: SrO being replaced with a combination of metallic oxides, $\Sigma Me^{+2}O$=aMgO+bCaO+cBaO, wherein a+b+c=1.

Without destroying the overall charge balance of the crystal lattice of the phosphor powder, the crystal lattice framework of the phosphor powder has been developed to control the performance of the phosphor powder: brightness, color ratio, particles size, for example. The framework according to the present invention includes all oxides of group IIA for all elements in the periodic table except SrO. It is known that the ionic radius of metal elements with +2 oxidation state are different; the ionic radius of $Mg^{+2}$ is $\tau_{Mg}$=0.58A; that of $Ca^{+2}$, $\tau_{Ca}$=1.05 A; and that of $Ba^{+2}$, $\tau_{Ba}$=1.20A. When different amounts of these elements are added into the phosphor powder containing group IIA elements, the average radius of group IIA ions can approach that of $Sr^{+2}$ ions ($\tau_{Sr}$=1.16 A). However, the solubility of $Eu^{+2}$ ions at lattice points increases with larger concentration of larger ions, $Ca^{+2}$ and $Ba^{+2}$. If a larger amount of $Mg^{+2}$ is found in the crystal lattice, the amount of reactive ions $Eu^{+2}$ will be decreased.

It is also considered that the compounds according to the present invention are produced from strontium spinel $SrAl_2O_4$. After the major performances are (slightly) changed, additional SrO or MeO oxides added will enter the main crystal lattice of spinel (and combine with the orthorhombic lattice phase).

From the following evidences, it can be proved that the major exciting agent has two oxidation states: (1) The excitation spectrum of the phosphor powder is a broadband emission, which is close to the spectrum of the $(Ca, Sr)_2SiO_4:Eu^{+2}$ in term of structure. Also, the oxidation state of Eu in the compound is exactly $Eu^{+2}$ and the excitation spectrum of the compound is very broad with an excited wavelength of $\lambda$=365~475 nm. (2) In the phosphor powder model proposed according to the present invention, the emission spectrum of the exciting agent ($Eu^{+2}$) falls into the category of broadband emission: $\lambda_{0.5}$>30~40 nm, instead of narrow band emission. It is widely known that the half bandwidth of the emission spectrum of $Eu^{+3}$ is $\lambda_{0.5}$=5~6 nm, which does not change much when migrating to different crystal lattices. (3) The luminescence of $\tau$=2.5 nano-seconds are because part of $Eu^{+3}$ ions to be located in $Al^{+3}$ (in this crystal lattice, there exists $Dy^{+3}$ ions of 3-valance state, which forms reactive pairs in the $(SrAl_2O_4:Eu^{+2}Dy^{+3}$ phosphor powder.).

The present invention discloses that a charge-transfer group forms in the phosphor powder according to the present invention. The charge-transfer group consists of the following constituents: $Eu_{Sr}^{+2}+O_O^-+Eu_{Al}^{+3}$. Each constituent in the charge-transfer group has its own distinct function: $Eu^{+2}$ ions form a broad excitation spectrum; $Eu^{+3}$ ions impose the narrow band emission of $Eu^{+3}$ into the broadband emission of $Eu^{+2}$ (the broad band is a distinct feature of CaS:Eu or SrS:Eu phosphor powder); oxygen ions exert their function in the charge transfer by changing oxidation state; an $O^{-2}$ ion gives away an electron to become $O^{-1}$, which becomes a charging ion charging $Eu^{+3}$ ion by passing an electron (e) to it. According to $Eu^{+3}+O^{-2}(\bar{e})+O^{-1}$, $Eu^{+3}$ ions receive an electron to return to its initial condition. Then, it is the well-known reaction: $Eu^{+2}+O^{-1}+Eu^{+2} \rightarrow E^{+3}*+O^{-2}*+Eu^{2+}$. The excited $Eu^{+3}$ ions will definitely emit and at the same time $Eu^{+2}$ will do so. If $Eu^{+3}$ ions give narrow band emission, then $Eu^{+2}$ ions give broad band emission, of which maximum radiation may be located at the green $SrAl_2O_4$:Eu band, yellow-green $(Sr,Ba)_2SiO_4$:Eu band, and red CaS:Eu band of the spectrum.

Consequently, the phosphor powder according to the present invention is characterized by its two emission centers, which belong to the same active ion, the europium ion. If electron paramagnetic resonance is not undertaken, it is difficult to determine the number and ratio of each active emission center. However, the half bandwidth of the spectrum curve proposed in the present invention can be employed to determine these values. The underlying principle of the method is to compare the half bandwidth of the spectrums of the compounds; for example, when the maximum wavelength is $\lambda$=616 nm, the half bandwidth of $Al_2O_3:Eu^{+3}$ $\lambda_{0.5}$=5 nm; when the maximum wavelength is $\lambda$=650 nm, the half bandwidth of $SrS:Eu^{+2}$ is $\lambda_{0.5}$>85 nm; when the maximum wavelength is $\lambda$=640 nm, the half bandwidth of the sample $(SrO)_4(Mg,Ca,Ba)_1OAl_2O_3$ synthesized according to the present invention is $\lambda_{0.5}$=45 nm. As for the decrease of the half bandwidth, it is possible only related to the second emission center $Eu^{+3}$. Nevertheless, the simplest ratio (85−45)/85≈55% suggests that $Eu^{+2}$ and $Eu^{+3}$ are equal in the phosphor powder according to the present invention. On the other hand, the phosphor powder according to the present invention has a half bandwidth of $\lambda_{0.5}$=80 nm, indicating that $Eu^{+2}$ has a value approaching 90% in the two-valence ions of the phosphor powder. Another advantage of the phosphor powder according to the present invention, the half bandwidth and maximum location of the emission band can be changed.

The condition to realize this important characteristic of the red phosphor powder is that the major group IIA anionic ions in the phosphor powder include: Mg from about 0.25 to about 0.90, Ca from about 0.001 to about 0.50, and Ba from about 0.01 to about 0.50, wherein the sum of the atomic fractions is equal to 1 ($Mg^+$ Ca+Ba=1). The analysis for the role of the Alkali earth metals in the phosphor powder indicates that the largest $Ba^{+2}$ ions entering $Me^{+2}$ group will induce the short-wave shift of radiation: from red to orange with a shift of $\Delta \leq 10$ μm, which is sufficient to change the luminescence purity and reduce color saturation of red light. On the other hand, $Mg^{+2}$ ions have a negligible effect on the spectrum structure, but have a strong effect on luminescent intensity. With the addition of a large amount of $Mg^{+2}$ ions, the brightness of the phosphor powder will be enhanced accordingly. When the concentration of magnesium is [Mg]=0.8 atomic fraction, the brightness of the phosphor powder increases by 25%. Another important function of the addition of $Mg^{+2}$ ions is to reduce the particles size of the phosphor powder. When the concentration of magnesium increases from about 0.25 to about 0.9 atomic fraction, the particles size of the phosphor powder is reduced from $d_{50}$=0.8 μm to $d_{50}$=0.5 μm.

The concentration of $Ca^{+2}$ in the phosphor powder will also change the crystal lattice of the compounds of the phosphor powder. When [Ca]≈0 atomic fraction, the crystal is an orthorhombic lattice; when [Ca]=0.50 atomic fraction, the crystal is a monoclinic crystal lattice. Also, the shape of the natural radiation spectrum will be changed as a result; the number of maximum value (peak) in the radiation spectrum will change from two to three or even four. When a large amount of $Ca^{+2}$ is added, a long wavelength shift of Δ=12 μm will occur. The aforementioned description explains the substantial change of crystal lattice in the $Me^{+2}O$ phosphor powder.

The maximum in the excitation spectrum of the red phosphor powder occurs at the wavelength of λ=390~50 nm, which is probably related to the charge transfer between $Eu^{+3}$ and $O^{-2}$ ions and the formation of $Eu^{+2}+O^{-1}$ valence group. The $Eu^{+2}+O^{-1}$ valence group is located in the radiation zone of the In—Ga—N heterojunction, which is in the range of λ=450~470 nm.

The present invention has noted that the abnormal broadband excitation spectrum starts in the near ultraviolet zone and ends in the green subband. As described earlier, the broadband excitation spectrum is probably only related to the charge-transfer band, in which charges move from oxygen or SrO ions to europium ions. Another scenario is that the charges of $Eu^{+3}$ ions should move very fast because there are four oxygen ions on the side of the excited ion. That the extended excitation zone of the half wavelength larger than 120 μam suggests the effectiveness of $Eu^{+2}$ is very large—excited ions $Eu^{+2}$ have a stronger effect than the data of $SrAl_2O_4$ in the phosphor powder, approaching that $Eu^{+2}$ of in CaS.

It has to point to that the integration of the phosphor powder with ultraviolet heterojunction or violet, blue-pale blue radiator can lead to this kind of broadband excitation spectrum. It is promising to apply the phosphor powder in light conversion agricultural film because if the phosphor powder is used in light conversion agricultural film, all the excitation energy accumulated in the ultraviolet and blue-green subbands will be stored in the red zone of the spectrum, speeding up the photosynthesis of green plants.

The main advantage of the red phosphor powder according to the present invention lies in the fact that the phosphor powder is excited by short-wavelength (less than 460 μm) light and emits light at the orange-red zone of wavelength λ>585 nm. The following description will summarize the advantages of the phosphor powder: Today's white light-emitting diodes generally have a maximum radiation spectrum at λ=575 nm ($Gd_3Al_5O_{12}$:Ce). Although some other oxides and nitrous oxides have a higher wavelength, their quantum output of radiation is not high. On the other hand, the phosphor powder according to the present invention has a red radiation spectrum of very high wavelength, and thus is suitable to be used in the making of white light-emitting diode. The phosphor powder may be used together with yttrium-aluminium (YAG), for example $Y_3Al_5O_{12}$:Ce, $Tb_3Al_5O_{12}$:Ce, $(Lu,Tb,Y)_3Al_5O_{12}$:Ce, and $(Sr,Ba)_2O_4$:Eu.

The following description will stress the synthesis characteristics of the red phosphor powder according to the present invention. There are three synthesis processes to produce the phosphor powder: (1) high-temperature solid-phase synthesis; (2) sol-gel process, in which phosphor powder particles undergo synthetic reaction in a liquid phase; and (3) micro-emulsion synthesis, in which micro-reaction phosphor powder particles according to colloidal chemistry undergo chemical reaction between particles.

The three methods have their respective advantages and disadvantages. High-temperature solid phase synthesis is very simple, but only at high temperature many solid phases can be formed and high temperature will reduce the brightness of the phosphor powder. Sol-gel process takes place at the temperature 300~400° C., but secondary phases cannot be overcome; also, particles agglomeration occurs in the phosphor powder during the sol-gel process and it takes time to fragment them. Micro-emulsion synthesis requires small particles of the phosphor powder and leads to a large amount of un-burned carbon impurities.

The aforementioned analysis points out that there is no common synthesis process to produce different compositions of phosphor powder, and it is probably no such common process. Therefore, the first aim of the present invention is to develop a new synthesis for the red phosphor powder based on strontium aluminate. The aforementioned description has explained the chemical composition of the red phosphor powder, of which strontium and aluminum oxides undergo mutual reactions during heating. The new synthesis process is characterized by $Sr(OH)_2.8H_2O$ hydroxide, which is used as the original ingredients for the compounds of strontium-barium group and $Mg(CH_3COO)_2.4H_2O$ and $Ca(CH_3COO)_2.4H_2O$ acetate hydrates as the original ingredients for the compounds of magnesium-calcium group. The aluminum hydroxide $Al(OH)_3$ is used as the basic compound of the phosphor powder and the initial amount of hydroxide is higher than its stoichiometric value by preferably 0.015~0.11%. There are physical and chemical distinctions between the new synthesis process and the existing elemental synthesis process for Group II aluminate. First, the new synthesis process does not have the carbonate elements of Group II, which are hard to be decomposed, for example $SrCO_3$, $CaCo_3$, $BaCo_3$ or $MgCO_3$. Instead, the new synthesis contains strontium and barium hydroxides, $Sr(OH)_2.8H_2O$ and $Ba(OH)_2.8H_2O$, which can be decomposed at rather low temperature T≦400° C. and will not undergo phase transformation during heating. Similarly, acetate hydrates, $Mg(CH_3COO)_2.4H_2O$ and $Ca(CH_3COO)_2.4H_2O$ can decomposed at T<500° C. without leaving carbon remnants.

The following example shows new synthesis processes are used to obtain the red phosphor powder according to the present invention.

Example 1

Prepare 0.4 M (mole)$Sr(OH)_2.8H_2O$,
0.05M $Mg(CH_3COO)_2.4H_2O$,
0.03 M $Ca(CH_3COO)_2.2H_2O$,
0.02 M $Ba(OH)_2.8H_2O$,
0.001M $Eu_2O_3$, and
2.02M $Al(OH)_3$ and put them into a planet ball mill for mixing at a rotation speed ω=1000 rotation/minute. Then, the ingredient is placed in a crucible of V=1000 ml, which is then heated in a furnace, filled with preferably an atmosphere of 99% $N_2$ and 1% CO. The furnace is heated to T=950° C. in 5° C./minute and kept at the temperature for two hours. The ingredient is then removed from the crucible and cleaned with hot water, and is ready for physical and chemical experiments. First, the chemical composition of the ingredient is consistent with the chemical formula, $(SrO)_4[(Mg,Ca,Ba)O]_1$ $Al_2O_3$, with a color of pale yellow, and it is easily dispersed in water. The phosphor powder excited by the blue light from light-emitting diodes emits strong orange-red light, of which chromaticity coordinate is x=0.645 and y=0.343. The brightness of the phosphor powder excited by the blue light from light-emitting diodes exceeds that of CaSEuLi phosphor powder. The average particles size of the phosphor powder according to the present invention is $d_{cp} \leq 2.1$ mm.

The excellent luminescence as well as physical and chemical parameters ensure the ingredient of the red phosphor powder can be added with 0.05% to 0.1% mole of $Al(OH)_3$ hydroxide remnant.

covered with suspending liquid based on organic silicon and the yellow phosphor powder based on yttrium aluminum garnet, $(Y,Gd)_3Al_5O_{12}$:Ce. If the suspending liquid is added with the aforementioned phosphor powder with the composition of $(SrO)_4[(Mg,Ca,Ba)O]Al_2O_4$:Eu$^{+2,3}$, the radiation of the light-emitting diodes can be shifted additionally toward warm red zone. Moreover, the shift of the radiation color temperature of light-emitting diodes is determined by the parameters of the red phosphor powder. All the lighting parameters of the phosphor powder are listed in TABLE 1.

TABLE 1

| No. | Chemical Compositions | Chromaticity Coordinates x | y | Relative Luminescence % | Color Temperature of light emitting diode, K | Luminesce Intensity (mcd) under 30 mA |
|---|---|---|---|---|---|---|
| 1 | $(SrO)_4(Mg_{0.5}Ca_{0.3}Ba_{0.2}O)Al_2O_3$:Eu | 0.645 | 0.343 | 122 | 3100 | 4500 |
| 2 | $(SrO)_4(Mg_{0.6}Ca_{0.2}Ba_{0.2}O)Al_2O_3$:Eu | 0.650 | 0.340 | 116 | 3000 | 3950 |
| 3 | $(SrO)_4(Mg_{0.9}Ca_{0.05}Ba_{0.05}O)Al_2O_3$:Eu | 0.655 | 0.338 | 112 | 2940 | 3800 |
| 4 | $(SrO)_4(Mg_{0.45}Ca_{0.45}Ba_{0.1}O)Al_2O_3$:Eu | 0.642 | 0.350 | 128 | 3190 | 5000 |
| 5 | $(SrO)_4(Mg_{0.4}Ca_{0.5}Ba_{0.1}O)Al_2O_3$:Eu | 0.638 | 0.354 | 136 | 3280 | 6000 |
| 6 | Standard Sample | | | 120 | 4500 | 6500 |

1 Remark: The mixture of the phosphor powder is used in the warm white light-emitting diodes and light-emitting diodes made with the mass ratio 20:80 of the red phosphor powder and yttrium aluminum garnet is preferable and can emit very uniform warm white light.

It is found that the aluminate hydroxide remnant is indispensable for the phosphor powder to form liquid drops or linear structure. If the addition of $Al(OH)_3$ hydroxide into the ingredient of the red phosphor powder is insufficient, the phosphor powder particles are nano-meter particles that will form the shape of flakes or a squamous structure of which the average particle size, $d_{cp}$, is 0.5-0.8 μm.

It is also found that the oxidation state of active Eu ions is determined by the heating period and each cycle's heating temperature of the ingredient. Two-stage calcining can obtain redder phosphor powder; the first stage is low-temperature calcining, from 150° C. to 200° C., and the second stage is from 950° C. to 1100° C. The furnace during the entire heating process is filled with weak-reduction atmosphere, which is preferably a mixture of 99% $N_2$ and 1% CO. While this mixture is preferred, several satisfactory mixtures would be sufficient, including mixtures with a CO content of 0.05 (5%) or less. The above process can produce the phosphor powder with a small particles size, of which the maximum particle size is $d_{50} \approx 500$ nm and the particles larger than 4 μm is less than 5%.

The following description will be focused on the application characteristic of the red phosphor powder. First, the characteristic comes from the properties of the phosphor powder (described earlier) according to the present invention, i.e. its excitation spectrum, regardless of blue, pale blue, or even pale blue-green zone, having a broad subband. The unique characteristics of the red phosphor powder can be applied in two specific areas: (1) the ingredient of light-emitting diodes with red subband, and (2) the filler of multi-layer polyethylene used in greenhouse and warm house.

The present invention has conducted related experiments for the application of the phosphor powder according to the present invention in double-layer white light-emitting diodes. Light-emitting diodes can be obtained with In—Ga—N heterojunction, which has a blue light wavelength of λ=460 nm in the spectrum. The radiation surface of the heterojunction is TABLE 1 indicates that the radiation color temperature of the light-emitting diodes can be lower than 4500K (the color temperature of light-emitting diodes can be as low as T=2940K, similar to that of the radiation of filament lamps, T=2850K). The luminescent color (chromaticity coordinate) and even the luminous intensity of the phosphor powder are substantially enhanced. The luminous intensity of the phosphor powder is very high, I=6000 mcd and 2θ=60°. The luminous intensity of the warm white light-emitting diodes reaches such a high value is rarely seen in the world.

Light conversion agricultural film is another application of the red phosphor powder according to the present invention. The study for this application direction is very active in today's agricultural biology research. Existing studies indicate that agricultural films filled with red phosphor powder can have 1.25~1.8 times of yields of various crops cultivated in greenhouses and warm houses. The phosphor powder excited by the ultraviolet in the sunlight emits red light to crops, thereby enhancing the photosynthesis of green plants. Also, with the phosphor powder, the rich vitamin C contained in vegetables and fruits can be increased to about three times.

The micro-sized particles of the red phosphor powder can be applied onto a single layer or multi-layer polyethylene thin films. The phosphor powder used in many patents (refer to U.S. Pat. No. 6,153,665, Nov. 28, 2000, by N. Soschin et al.; Malaysian Patent MY PA 01004165A, 26.04.2001; and Canadian patent) is sulphur-oxide, $Ln_2O_2S$:Eu. However, the present invention has found that similar photo biological reaction can only occur when polymer films are filled with the red phosphor powder according to the present invention. When the red phosphor powder is added into agricultural films, the optimum mass concentration is 0.1~1.5%.

In summary, the light-emitting diodes according to the present invention has a uniform luminescence color, a warm white emission, a chromaticity coordinate of $0.41 \leq x \leq 0345$ and $0.40 < y \leq 0.43$, and a color temperature of $2800 \leq T \leq 3400K$. Also, the light-emitting diodes according to the present invention can create a light source of higher brightness and larger luminous flux, and can indeed overcome the drawbacks of conventional warm white light-emitting diodes.

It is appreciated that although the directional practice device of the present invention is used in a very limited space instead of practicing at the real playing field, effective and steady practice can be obtained as well. Further, it is very easy to set up and to operate the directional practice device of the present invention. These advantages are not possible to achieve with the prior art.

While the invention has been described with reference to the a preferred embodiment thereof, it is to be understood that modifications or variations may be easily made without departing from the spirit of this invention, which is defined by the appended claims.

What is claimed is:

1. A red phosphor powder based on strontium aluminate, using europium (Eu) as an exciting agent, and characterized by that its chemical equivalence formula is $(SrO)_4(\Sigma Me^{+2}O)_1 Al_2O_3$: Eu, wherein $Me^{+2}$ is Mg, Ca, Ba, and mixtures thereof.

2. The red phosphor powder as defined in claim 1, wherein the exciting agent europium has two different oxidation states, $Eu^{+2}$ and $Eu^{+3}$.

3. The red phosphor powder as defined in claim 2, wherein the ionic ratio of the different states of the exciting agent europium is $[Eu^{+2}]/[Eu^{+3}]=1:10\sim1:1$.

4. The red phosphor powder as defined in claim 1, wherein the concentrations of Mg, Ca, and Ba are Mg from about 0.025 to about 0.90, Ca from about 0.001 to about 0.5, Ba from about 0.001 to about 0.5, and Mg+Ca+Ba=1.

5. The red phosphor powder as defined in claim 1, wherein the maximum in the excitation spectrum of the red phosphor powder occurs at the wavelength of $\lambda=390\sim550$ nm, in which the maximum is related to the charge transfer between $Eu^{+3}$ and $O^{-2}$ ions and the formation of $Eu^{+2}+O^{-1}$ valence group.

6. The red phosphor powder as defined in claim 1, wherein the phosphor powder excited by short wavelength radiation, shorter than 460 nm, emits in the orange-red zone, $\lambda>585$ nm.

7. A warm white light-emitting diode, wherein the warm white light-emitting diode uses In—Ga—N heterojunction as its substrate and the surface of the In—Ga—N heterojunction is covered with a phosphor powder based on yttrium aluminum garnet, which is characterized by that the yttrium aluminum garnet is admixed with the red phosphor powder defined in claim 1.

8. A warm white light-emitting diode as defined in claim 7, wherein the mass concentration of the red phosphor powder is 20%.

9. A multi-layer polyethylene thin film for use in greenhouse or warm house based on high density polyethylene and its derivative, which contains inorganic phosphor powder, the thin film being characterized by that it contains the red phosphor powder as defined in claim 1.

10. A multi-layer polyethylene thin film as defined in claim 9, wherein the amount of the red phosphor powder added is about 0.1~1.5% in mass concentration of the polymer and phosphor powder mixture.

* * * * *